(12) United States Patent
Koike et al.

(10) Patent No.: US 7,448,861 B2
(45) Date of Patent: Nov. 11, 2008

(54) RESIN MOLDED SEMICONDUCTOR DEVICE AND MOLD

(75) Inventors: Masahiro Koike, Kanagawa (JP); Hirochika Narita, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 308 days.

(21) Appl. No.: 11/235,182

(22) Filed: Sep. 27, 2005

(65) Prior Publication Data
US 2006/0071321 A1 Apr. 6, 2006

Related U.S. Application Data

(62) Division of application No. 10/870,023, filed on Jun. 18, 2004, now Pat. No. 7,265,444.

(30) Foreign Application Priority Data
Jun. 26, 2003 (JP) ............................. 2003-182488

(51) Int. Cl.
*B29C 45/14* (2006.01)
*H01L 21/56* (2006.01)

(52) U.S. Cl. ..................................... 425/116
(58) Field of Classification Search .................. 425/116
See application file for complete search history.

(56) References Cited

U.S. PATENT DOCUMENTS

| | | | |
|---|---|---|---|
| 3,981,074 A * | 9/1976 | Yamamoto et al. ...... 264/272.17 |
| 4,663,833 A * | 5/1987 | Tanaka et al. .................. 438/65 |
| 5,041,902 A | 8/1991 | McShane |
| 5,256,901 A | 10/1993 | Ohashi et al. |
| 5,458,716 A | 10/1995 | Alfaro et al. |
| 5,529,959 A | 6/1996 | Yamanaka |
| 5,622,873 A * | 4/1997 | Kim et al. ...................... 438/65 |
| 5,653,891 A | 8/1997 | Otsuki et al. |
| 5,869,883 A * | 2/1999 | Mehringer et al. .......... 257/667 |
| 5,897,338 A * | 4/1999 | Kaldenberg ................. 438/116 |

(Continued)

FOREIGN PATENT DOCUMENTS

JP 59028361 A * 2/1984

(Continued)

OTHER PUBLICATIONS

Japanese Office Action dated Jan. 28, 2008 with partial English Translation.

*Primary Examiner*—Robert B Davis
(74) *Attorney, Agent, or Firm*—McGinn IP Law Group, PLLC (57) ABSTRACT

To provide an excellent image by reducing buckling of a CCD device having one-dimensional CCD elements mounted thereon due to changes in temperature. Blackening treated iron or iron-based alloy is used as a material of a heat sink 11 having a one-dimensional CCD element 14 mounted thereon. The thermal coefficient of expansion of the heat sink 21 is matched with that of a hollow molded case 12 for integrally molding the heat sink 11 and a lead frame 20. A plurality of projections 21 formed on the side of the hollow molded case 12 are disposed at a bonding interface between the glass cap 13 which closes an upper opening of the hollow molded case 12 and side walls of hollow molded case 12.

18 Claims, 12 Drawing Sheets

U.S. PATENT DOCUMENTS

| | | |
|---|---|---|
| 5,986,333 A | 11/1999 | Nakamura |
| 5,997,798 A * | 12/1999 | Tetreault et al. ............. 264/510 |
| 6,028,354 A | 2/2000 | Hoffman |
| 6,300,169 B1 * | 10/2001 | Weiblen et al. ............. 438/127 |
| 6,333,211 B1 * | 12/2001 | Sato et al. .................... 438/126 |
| 6,350,113 B1 * | 2/2002 | Miyajima ..................... 425/89 |
| 6,476,469 B2 | 11/2002 | Hung et al. |
| 6,509,636 B1 | 1/2003 | Tsai et al. |
| 6,525,405 B1 | 2/2003 | Chun et al. |
| 6,545,332 B2 | 4/2003 | Huang |
| 6,680,525 B1 | 1/2004 | Hsieh et al. |
| 6,696,752 B2 | 2/2004 | Su et al. |
| 6,700,190 B2 * | 3/2004 | Siegel et al. ................. 257/684 |
| 6,844,621 B2 | 1/2005 | Morozumi et al. |
| 6,858,910 B2 * | 2/2005 | Coyle et al. ................. 257/415 |
| 7,205,175 B2 * | 4/2007 | Raben .......................... 438/65 |
| 2002/0180019 A1 | 12/2002 | Saito et al. |
| 2003/0042598 A1 | 3/2003 | Crane et al. |
| 2004/0173887 A1 | 9/2004 | Jang et al. |

FOREIGN PATENT DOCUMENTS

| | | |
|---|---|---|
| JP | 59-63735 | 4/1984 |
| JP | 62-89160 U | 6/1987 |
| JP | 2-62743 U | 5/1990 |
| JP | 4-337668 | 11/1992 |
| JP | 4-360576 | 12/1992 |
| JP | 4-369860 | 12/1992 |
| JP | 5-315461 | 11/1993 |
| JP | 6-209050 | 7/1994 |
| JP | 6-252277 | 9/1994 |
| JP | 6-252281 | 9/1994 |
| JP | 6-268085 | 9/1994 |
| JP | 7-7098 | 1/1995 |
| JP | 9-22954 | 1/1997 |
| JP | 10-247695 | 9/1998 |
| JP | 2001-326292 | 11/2001 |
| JP | 2002-158391 | 5/2002 |
| JP | 2002-334975 | 11/2002 |

* cited by examiner

RESIN MOLDED SEMICONDUCTOR DEVICE AND MOLD

The present Application is a Divisional Application of U.S. patent application Ser. No. 10/870,023, filed on Jun. 18, 2004 now U.S. Pat. No. 7,265,444.

FIELD OF THE INVENTION

The present invention relates to a resin molded semiconductor device and a molding die for molding the same and in particular to a resin molded semiconductor device having a structure which is preferable as a one-dimensional CCD device and a molding die which is used for molding the CCD device.

BACKGROUND OF THE INVENTION

One-dimensional CCD device (CCD semiconductor device) comprises 5000 to 10000 phototransistors which are arrayed in a linear manner and is used as an imaging device for copying machines or facsimiles. In the one-dimensional CCD device, photo-scanning is conducted based on relative movement between an original document and the CCD device per se in a direction perpendicular to the array direction of the phototransistors, so that an image of the whole of one sheet of the original document is picked up.

Figure 10:
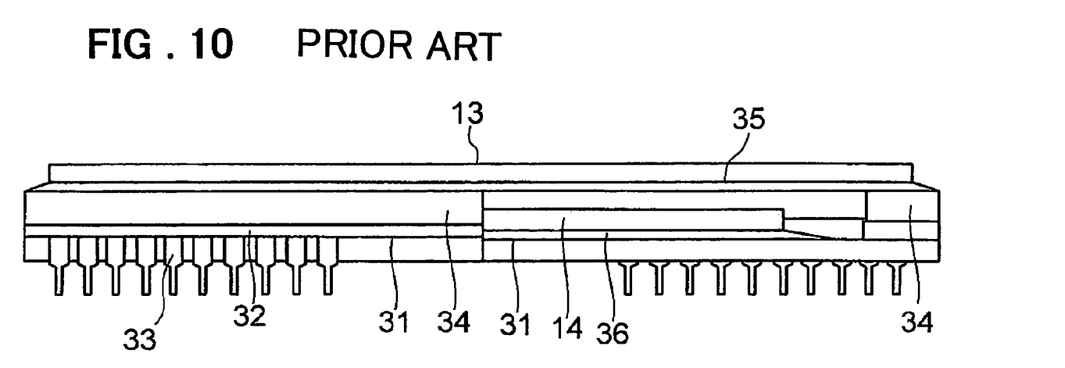
FIG. 10 is a longitudinal sectional view showing the CCD device using a prior art ceramic package.

The structure of prior art one-dimensional CCD device will be described with reference to drawings. FIG. 10 is a longitudinal sectional view showing a prior art ceramic packaged CCD device, which is disclosed in Japanese Patent Kokai Publication No. JP-P2002-334975A. The ceramic package is manufactured by bonding a lead frame including leads 33 on a flat ground ceramic base 31 with a low melting point glass bonding agent 32 and then by bonding a flat ground ceramic frame 34 on the lead frame with the low melting point glass bonding agent 32.

A semiconductor chip 14 comprising a CCD element is accommodated within a hollow space of the ceramic package and is bonded to a support face of the ceramic base 31 with a mount material 36. After wire-bonding of the inner leads within the ceramic base 31 with the bonding pads of the CCD element 14, a glass cup 13 is bonded to the ceramic package with a thermosetting bonding agent 35 for sealing the upper opening of the ceramic package.

Figure 11:
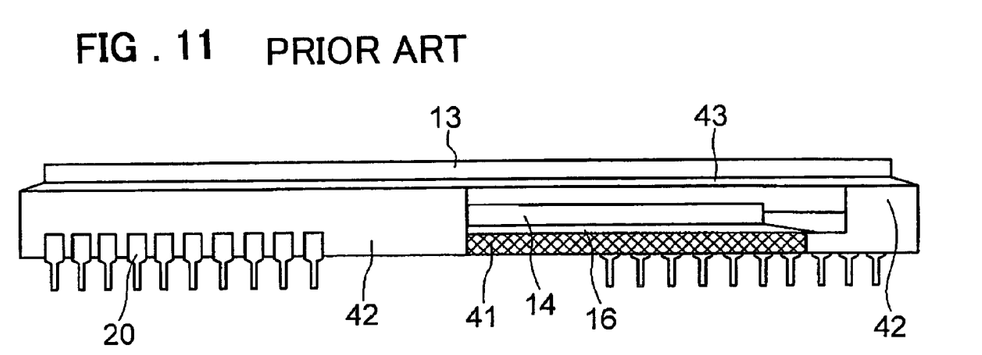
FIG. 11 is a longitudinal sectional view showing the CCD device using a prior art molding resin.

FIG. 11 is a sectional view showing a prior art cavity (hollow) molded CCD device. A structure which is similar to this structure is disclosed in the cited patent specification as a prior art. In this type of CCD device, a composite lead frame is manufactured by bonding a copper lead 20 to a heat sink 41 made of aluminum or a copper alloy. The composite lead frame is accommodated in a molding die. A molding resin is injected into a cavity of the molding die to manufacture a hollow molded case 42.

The CCD element 14 is die-bonded to the upper face of the heat sink 41 within the hollow molded case 42. After wire-bonding of the inner leads in the molded case 41 with the bonding pads of the CCD element 14, the upper opening of the hollow molded case 42 is closed with the glass cap 13 for sealing the upper opening with an ultraviolet ray curable bonding agent 43. The ultraviolet ray curable bonding agent 43 is composed of a high-elasticity resin material having a Shore hardness (D scale) of 80 or more.

Figure 12:
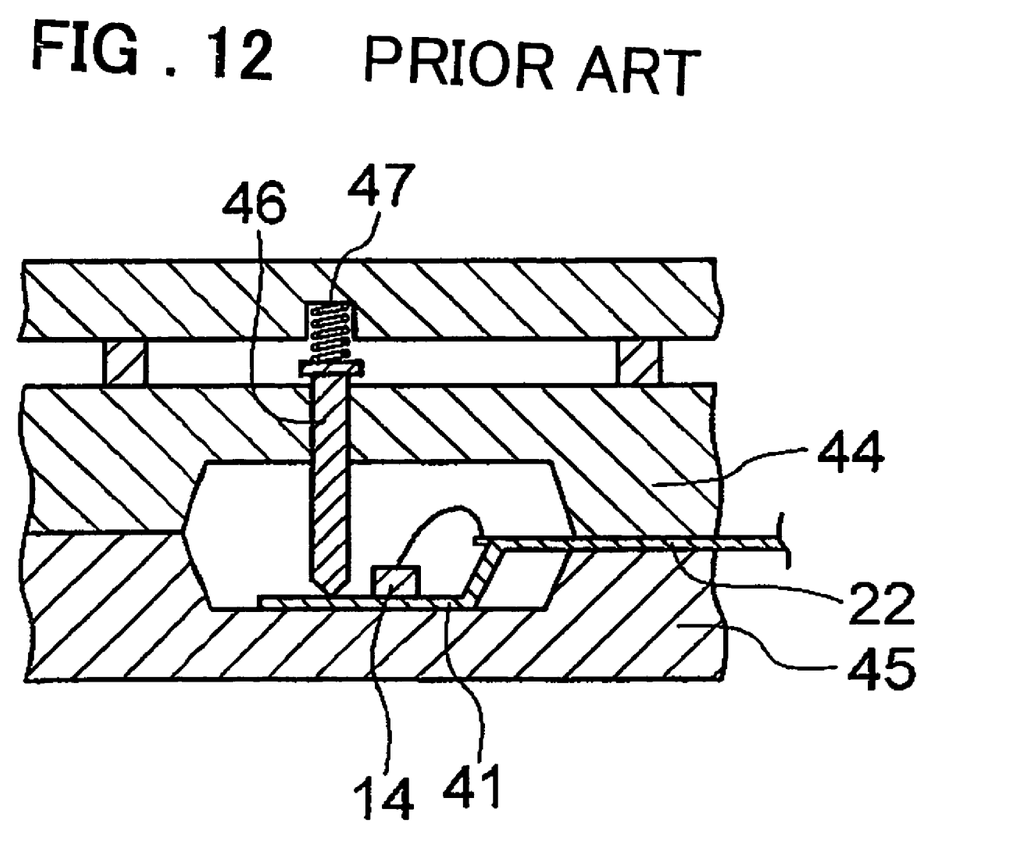
FIG. 12 is a sectional view showing a prior art molding die.

The molding die shown in FIG. 12 which is used for forming the hollow molded package is disclosed in, for example, Japanese Patent Kokai Publication No. JP-A-59-63735. The molding die comprises upper and lower half molds 44 and 45.

The heat sink 41 and semiconductor chip 14 are placed in the molding die so that they are buried in the package. Then molding is conducted. When molding is conducted in the process of the cited patent specification, the heat sink 41 having a surface on which the semiconductor chip 14 is mounted is disposed on the lower half mold 45. After the lead frame 22 is secured in position, the upper half mold 45 is set for resin sealing. In order to prevent the formation of a gap between the heat sink 41 and lower half mold 45, the heat sink 41 is biased against the inner surface (bottom surface of cavity) of the lower half mold 45 by means of a pin having a cone-shaped end 46 which is biased by a spring 47.

[Patent Document 1]
Japanese Patent Kokai Publication No. JP-P2002-33475A
[Patent Document 2]
Japanese Patent Kokai Publication No. JP-A-59-63735

SUMMARY OF THE DISCLOSURE

Since the ceramic package shown in FIG. 10 is made of a ceramic material having a low thermal coefficient of expansion, it has an advantage that warping of the whole of the CCD element is prevented in the wide range of temperatures. However, manufacturing of the ceramic package requires an extended period of time in each of steps including baking, and grinding for flattening of the ceramic material, and bonding with a low melting point glass bonding agent. Thus the ceramic package is very expensive, so that the cost of the CCD devices using the ceramic package is increased.

The hollow molded CCD device shown in FIG. 11 has an advantage that it can be manufactured from a cheap resin molding material. Although warping deformation of the chip can be suppressed to a small amount at indoor temperature, deformation of the package may occur depending upon changes in temperature within electronic equipment having the CCD device mounted thereon when the equipment is operated, so that the warping of the CCD element in a longitudinal direction changes in the range of 10 to 150 microns. Thus, it is difficult precisely reproduce fine original document on copying thereof.

The present invention has been achieved in view of the above-mentioned problem of the prior art. It is therefore an object of the present invention to provide a resin molded semiconductor device in which deformation of the semiconductor chip can be suppressed to a small amount versus change in temperature in spite of using a cheap resin molded package and also to provide a molding die which can be used for manufacturing the same.

According to a first aspect of the present invention there is provided a resin molded semiconductor device including a heat sink having a support face, a semiconductor chip mounted on the support face, a lead frame which is electrically connected to the semiconductor chip therein, and a resin molded case which forms a space for accommodating the semiconductor chip and molds the lead frame and heat sink. The invention is characterized in that the thermal coefficient of expansion of said resin molded case is matched with that of the heat sink.

In the resin molded semiconductor device of the present invention, warpage of the semiconductor chip which is accommodated in a cavity formed by the resin molded case and the heat sink and is mounted on the heat sink can be suppressed to a small amount due to the fact that matching of the thermal coefficients of expansion of the resin molded case and the heat sink is achieved. Matching of the thermal coefficients of expansion is also achieved by the fact that the sum of the reaction contraction of the resin mold which is caused when it is cured and the thermal contraction of the resin mold which is caused by lowering of its temperature on curing depending upon its thermal coefficient of expansion is substantially equal to the contraction of the heat sink which is caused by lowering of its temperature depending upon its thermal coefficient of expansion.

In a preferred resin molded semiconductor device of the present invention, the heat sink is made of iron or an iron-based alloy, the surface of which is treated for blackening.

In a further preferred embodiment of the present invention, the resin molded case has an opening on the upper face thereof and in that a glass cap which closes the opening is secured to the resin molded case by a bonding agent layer having the D scale Shore hardness of 60 or less. Warpage of the resin molded case due to the difference between the thermal coefficients of expansion of the glass cap and the resin molded case is reduced by using the bonding agent layer having the D scale Shore hardness of 60 or less. It is preferred that the resin molded case is provided on its face to be bonded to the cap with at least either one of a plurality of projections or depressions. Adoption of such a structure makes a volume to be occupied by the adhesive agent layer larger, so that the warpage of the resin molded case due to the difference between the thermal coefficients of expansion of the glass cap and the resin molded case is reduced to provide an increased effect of warpage prevention.

The present invention provides a significant effect if the semiconductor chip is applied to a CCD device comprising a one-dimensional CCD element since the influence of the warpage upon the one-dimensional CCD element is particularly larger than that of the other semiconductor devices.

In case where the material of the heat sink is blackening-treated iron or an iron-based alloy, it is preferred that the resin molded case has a thermal coefficient of expansion which is in the range of 8 to 14 ppms. In this case, the thermal coefficients of expansion of the heat sink and the resin molded case are well matched with each other.

According to second aspect of the present invention, there is provided a molding die made up of a first half mold having a first cavity and a second half mold having a second cavity, the first cavity including a block for forming a semiconductor chip accommodating space. The molding die is characterized in that the block is formed of a two-step structure comprising a wide portion which is in contact with the bottom of the first cavity and a narrow portion which is mounted on the wide portion, provided that a pressing pin which presses a lead frame which is connected to a semiconductor chip upon the wide portion extends from the bottom of the second cavity.

Since sticking of resin to the inner leads on molding is prevented in the molding die of the present invention, troubles when the semiconductor chip is placed in an accommodating space after molding and the bonding pads of the semiconductor chip are connected to the inner leads of the lead frame by bonding wires can be prevented from occurring.

In a preferred mold of the present invention, another pressing pin which projects from the narrow portion toward the second cavity is disposed so that it is variably extendable (i.e., extends with a variable length of projection) from the surface of the narrow portion. Sticking of molding resin to the bottom of the heat sink can be prevented.

PREFERRED EMBODIMENTS OF THE INVENTION

Figure 1A:
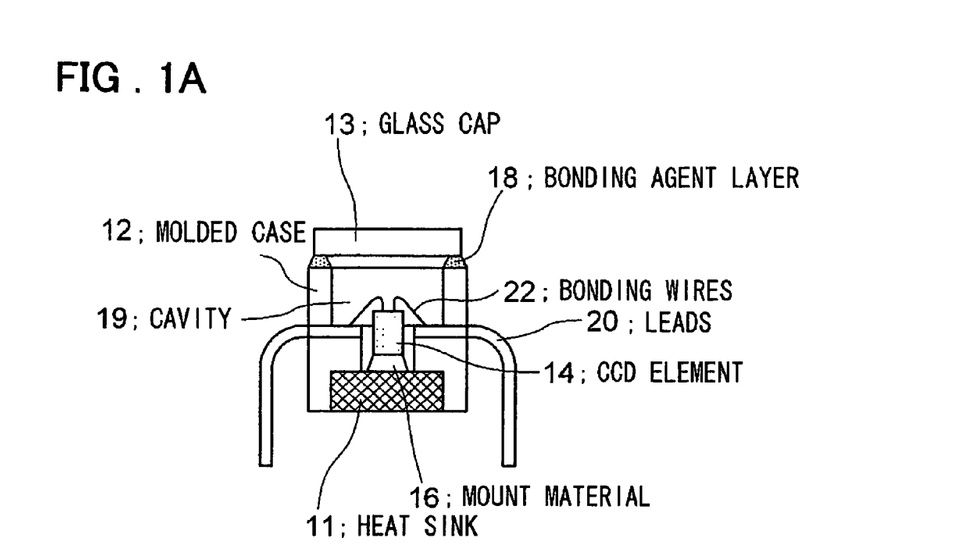
FIGS. 1A and 1B are a cross-sectional and longitudinal sectional views of the CCD device which constitutes a resin molded semiconductor device of a first embodiment of the present invention, respectively.
Figure 1B:
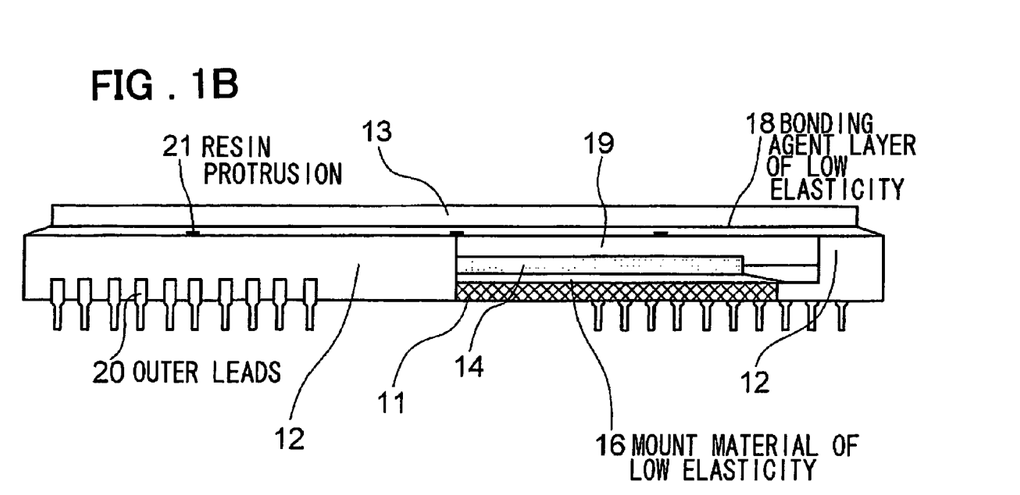

Now, preferred embodiments of the invention will be described in detail with reference to drawings. Like elements are designated with like numerals through the drawings. FIGS. 1A and 1B show the structure of a CCD device of one embodiment of the present invention and are a cross-sectional view and partly longitudinal sectional view, respectively. The CCD device of the embodiment comprises a heat sink 11 made of iron or an iron-based alloy, a hollow molded case 12 which forms a semiconductor chip accommodating space (cavity) 19 on the heat sink 11 (hereinafter simply referred to as "molded case"), a CCD element (semiconductor chip) 14 which is mounted on a support face of the heat sink 11 and is accommodated in the cavity 19, metallic leads 20 including inner and outer leads which are connected to the bonding pads of the CCD element 14, and a glass cap 13 which closes an upper opening of the molded case 12.

The molded case 12 is molded on and is secured to the sides and the upper face of the heat sink 11 excepting its central support face. A plurality of resin projections 21 are provided on the top of the side walls which define the upper opening of the molded case 12 so that they are linearly arrayed. The glass cap 13 is secured to the top of the sidewalls of the molded case 12 with a low elasticity bonding agent layer 18. The metallic leads 20 are connected to the bonding pads of the CCD element 14 via bonding wires 22 and are extended externally through the side walls of the molded case 12. The metallic leads 20 are made of a cupper alloy.

The CCD element 14 is secured to the support face of the heat sink 11 via a low elasticity mount material (bonding agent) 16 which is disposed therebetween. The CCD element 14 is accommodated in the cavity 19 so that the center of the CCD element 14 in a width direction is aligned with the central line of the molded case 12. The molded case 12 forms a housing for accommodating the CCD element therein together with the heat sink 11 and glass cap 13. As shown in FIG. 1B, the metallic leads 20 are disposed so that they are divided into two arrays on the sides of the CCD device and they are spaced one another in a longitudinal direction of the CCD device. The inner leads are connected to the bonding pads of the CCD element 14 by the bonding wires 22. Each of the metallic leads extends through the molded case 12 and is then bent so that it becomes an outer lead of the CCD device.

Figure 2A:
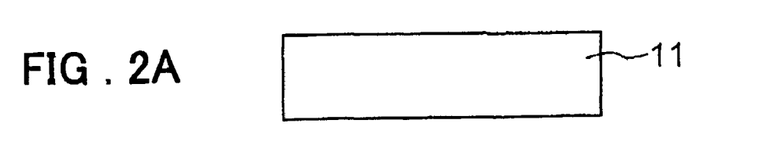
FIGS. 2A through 2D are plan views showing the steps of the manufacturing process of the semiconductor device shown in FIG. 1.
Figure 2B:
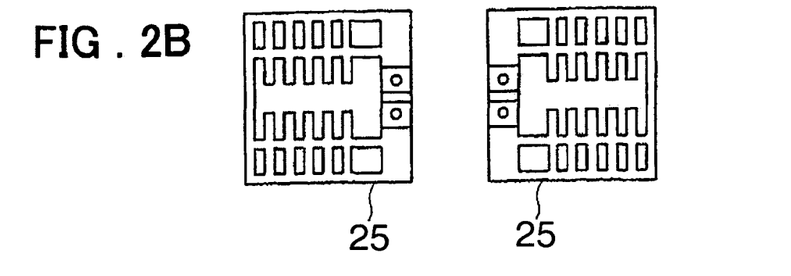
Figure 2C:
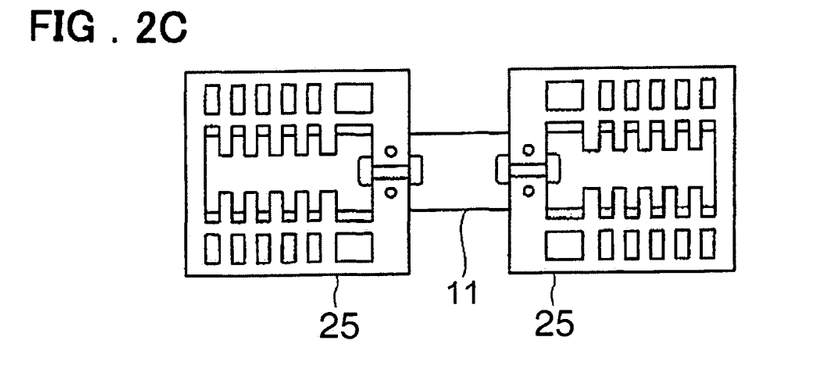

FIGS. 2A through 2D and 3A through 3C show the top views of the CCD device of the present embodiment at respective steps of manufacturing. For manufacturing of the CCD device, a heat sink 11 having an elongated support face, which is formed of an iron-based alloy, the surface of which is blackening treated is prepared (FIG. 2A). Blackening treatment is carried out for the purpose of preventing rusting and random reflection of light. A pair of lead frames 25 (FIG. 2B) made of a cupper alloy are secured to the vicinity of the opposing ends of the heat sink 11 to provide a composite lead frame (FIG. 2C).

Figure 2D:
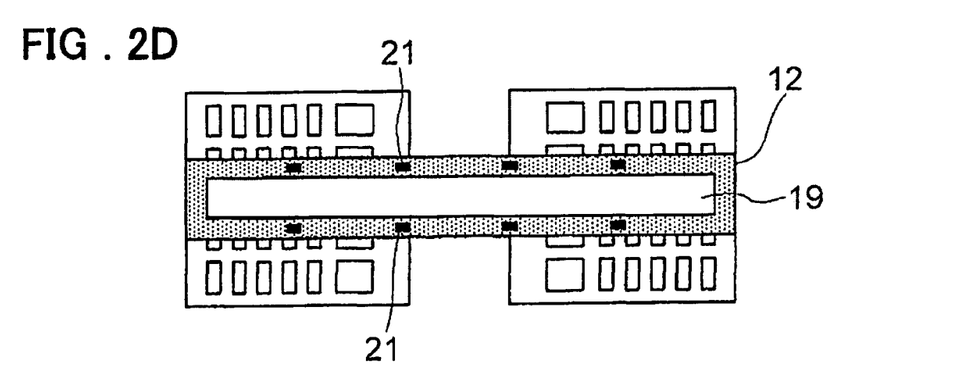
Figure 3A:
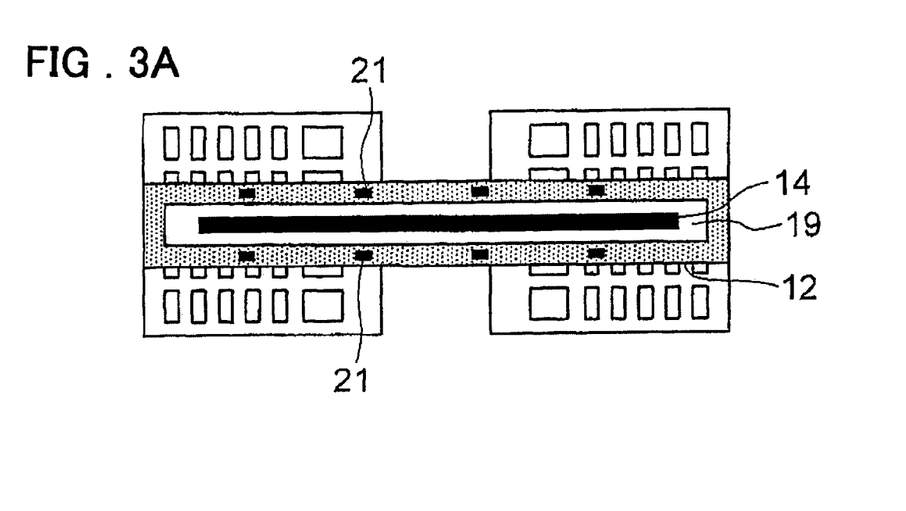
FIGS. 3A through 3C are plan views showing the steps of manufacturing process subsequent to the steps of FIG. 2.

A thermosetting insulating resin is molded on the obtained composite lead frame excepting the outer leads is in the form of a frame to provide a molded case having a cavity 19 therein (FIG. 2D). The thermosetting insulating resin has a thermal coefficient of expansion which matches with that of the iron-based alloy which forms the heat sink. At this step, a plurality of resin projections are formed on the top of the side walls which define an upper opening of the hollow molded case 12. The CCD device 14 is mounted on and is secured to the support face of the heat sink 11 by using a thermosetting low elasticity mount material 16 (FIG. 3A). The inner leads of the lead frame are connected to the bonding pads of the CCD element 14 with bonding wires 24.

Figure 3B:
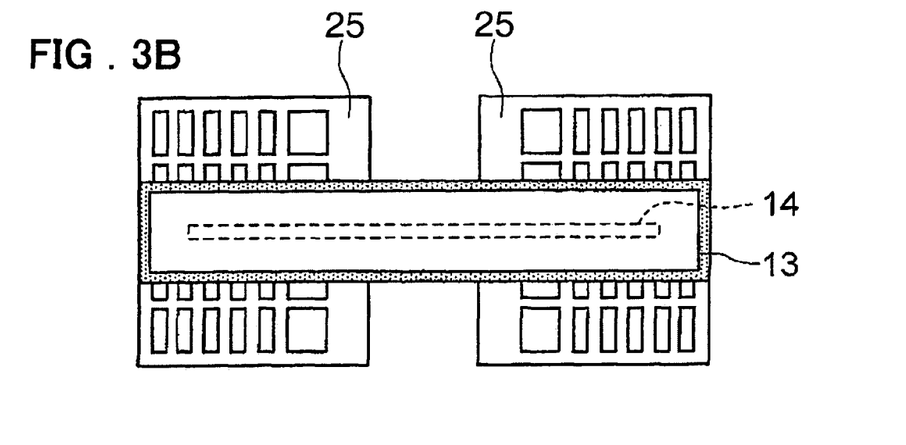
Figure 3C:
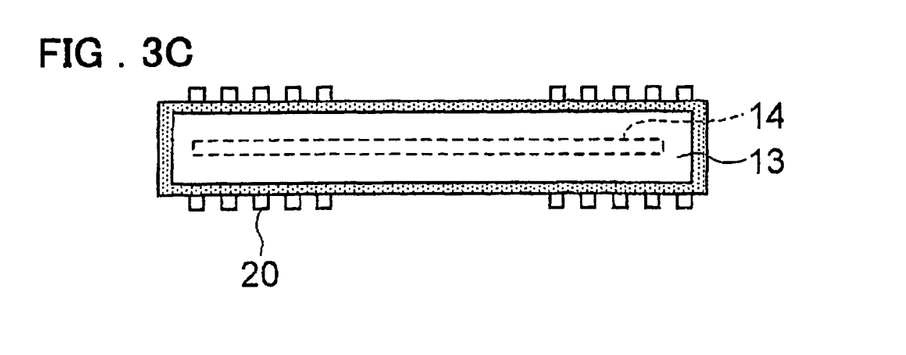

Subsequently, the glass cap 13 is applied to the upper opening of the hollow molded case 12 with the thermosetting low elasticity bonding agent 18 to seal the cavity 19 in which the CCD element 4 is accommodated (FIG. 3B). Then, the CCD device of the present embodiment is obtained by removing unnecessary portion of the lead frame 25 and bending the outer lead portions (FIG. 3C).

In the CCD device of the present embodiment, a one-dimensional CCD element having photosensors which are linearly arrayed is used for electronic equipment such as copying machines or scanners having an image reading capability. The temperature in the electronic equipment is elevated to about 100° C. which is higher than room temperature when the equipment is operated. If the warpage of the mounted CCD element is large, the focus of the image of the original document is not aligned with the surface of photosensors, resulting in a low image quality. In the present embodiment, the hollow molded case is used rather than expensive ceramic package and a heat sink made of an iron-based alloy is used rather than prior art heat sink made of aluminum which has been used together with the hollow molded case. This allows to suppress the warpage of the CCD element to about ±10µm which does not give any influence upon image quality. This is enabled mainly by matching the thermal coefficient of expansion of the hollow molded case to that of the iron based alloy.

The CCD element 14 is a silicon semiconductor chip having, for example, a length of 80 mm, a width of 0.5 mm and a thickness of 0.6 mm, which is very elongated in shape. The CCD element 14 is secured to the upper face, which forms the support face of the heat sink 11 on the bottom of the molded case 12. Accordingly, the CCD element 14 is deformed so that it conforms to the surface shape on the upper face of the heat sink 11. If the surface of the heat sink 11 is warped in a convex manner (this warpage is hereinafter referred to as "positive warpage" and reverse warpage is referred to as "negative warpage"), the CCD element 14 would also be warped in a convex manner. The hollow molded case 12 is manufactured by placing the composite lead frame having the heat sink 11 made of an iron based alloy which is bonded to the lead frame into a molding die which is heated to about 175° C. and by transfer molding the composite lead frame with an epoxy resin compound.

When the manufactured hollow molded case is removed out from the mold, warping of the hollow molded case 12 occurs due to the difference between the thermal contraction (contraction amount based upon the thermal coefficient of expansion) of the heat sink in the course of cooling to room temperature and the contraction amount which is a sum of the contraction amount based upon the thermal coefficient of expansion of the epoxy resin compound and the reaction contraction amount due to the resin curing reaction. The direction and amount of the warpage of the heat sink surface follow those of the hollow molded case 12. In the present embodiment, the contraction amount of the mold resin is matched with that of the heat sink by using a mold resin having a thermal coefficient of expansion of 9 to 13 ppm and a reaction contraction amount of about 0.1% for the heat sink made of an iron-based alloy having a thermal coefficient of expansion of 13 to 14 ppm. The warpage amount of the heat sink surface is suppressed to ±10µm or less for the CCD element having a full length of 80 mm. In other words, the warpage ratio is suppressed to about 0.01%.

A glass cap 13 having a thermal coefficient of expansion of about 3 to 6 ppm is mounted on the upper opening of the hollow molded case 12. In the present embodiment, the thermal coefficient of expansion of the hollow molded case 12 does not match with that of the glass cap 13 at the bonding interface therebetween. Projections 21 exist on the top of the side walls of the hollow molded case at the bonding interface. A stress which is caused by the difference between the thermal coefficients of expansion of the hollow molded case 12 and the glass cap 13 is absorbed and cancelled by the expansion or contraction of the low elasticity bonding agent layer due to the fact that the thickness of the low elasticity bonding agent layer is larger than the height of the projections. Accordingly, the warpage deformation of the hollow molded case 12 is mitigated. This also mitigates the warpage of the CCD element on operation of the electronic equipment, so that the focal point of the image of the original document is aligned with the photosensor surface to keep excellent image quality.

As mentioned above, the resin molded semiconductor device of the present invention contemplates to reduce the warpage of the semiconductor chip 14 by forming the hollow molded case of a resin material having a thermal coefficient of expansion which matches with that of the heat sink 11 for dissipating heat generated from the semiconductor chip 14. Warping deformation of the semiconductor chip 14 is suppressed by using the low elasticity bonding agent layer 18 having an enough volume at the bonding interface between the hollow molded case 12 and the glass cap 13 when the upper opening of the hollow molded case 12 is closed by the glass cap 13 having a thermal coefficient of expansion which is difficult to match with that of the hollow molded case 12.

Therefore, if a heat sink made of alumina ceramic having a low thermal coefficient of expansion such as about 65 ppms is used in lieu of the heat sink 11 made of iron or an iron-based alloy, a hollow molded case can be manufactured by using a resin material having a thermal coefficient of expansion which is adjusted to 65 to 80 ppms.

Figure 4A:
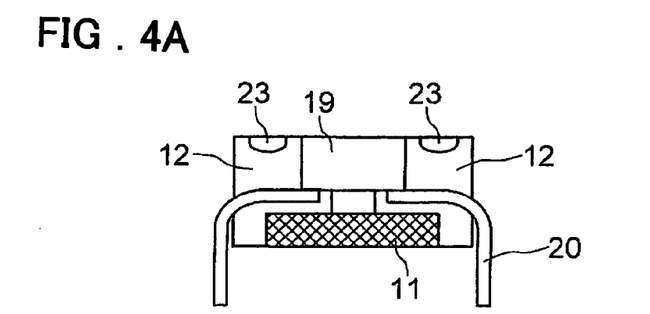
FIG. 4A and 4B are a cross-sectional and longitudinal sectional views of the CCD device which constitutes a resin molded semiconductor device of a second embodiment of the present invention, respectively.
Figure 4B:
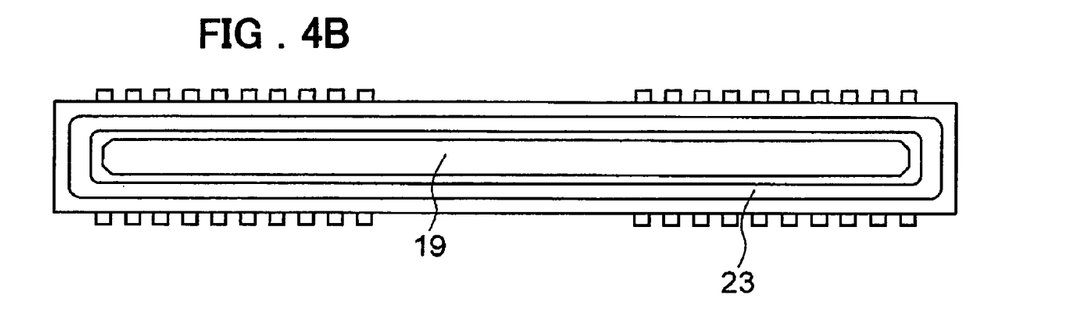

FIGS. 4A and 4B are a cross sectional view and horizontal longitudinal sectional view showing a housing of the resin molded semiconductor device of a second embodiment of the present invention, respectively. In the second embodiment, warpage due to the difference between the thermal coefficients of expansion of the hollow molded case 12 and the glass cap (not shown) is prevented by providing a plurality of depressions 23 on the top of the side walls which define the upper opening of the molded case 12 and then filling the depressions with a low elasticity bonding agent.

Figure 5A:
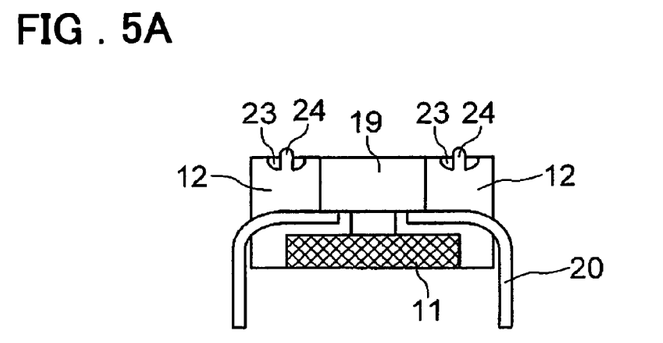
FIG. 5A and 5B are cross-sectional and longitudinal sectional views of the CCD device which constitutes a resin molded semiconductor device of a third embodiment of the present invention, respectively.
Figure 5B:
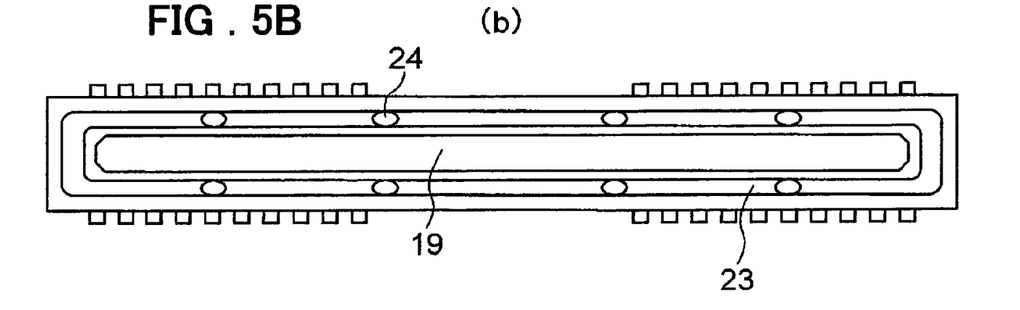

FIGS. 5A and 5B are a cross sectional view and horizontal longitudinal sectional view showing a housing of the resin molded semiconductor device of a third embodiment of the present invention, respectively. In the third embodiment, warpage due to the difference between the thermal coefficients of expansion of the hollow molded case 12 and the glass cap (not shown) is prevented by providing a plurality of depressions 23 and projections 24 on the top of the side walls which define the upper opening of the molded case 12 and then filling the depressions with a low elasticity bonding agent to provide an enough volume of the bonding agent and an enough volume of the low elasticity bonding agent layer with the projections 24.

Figure 6:
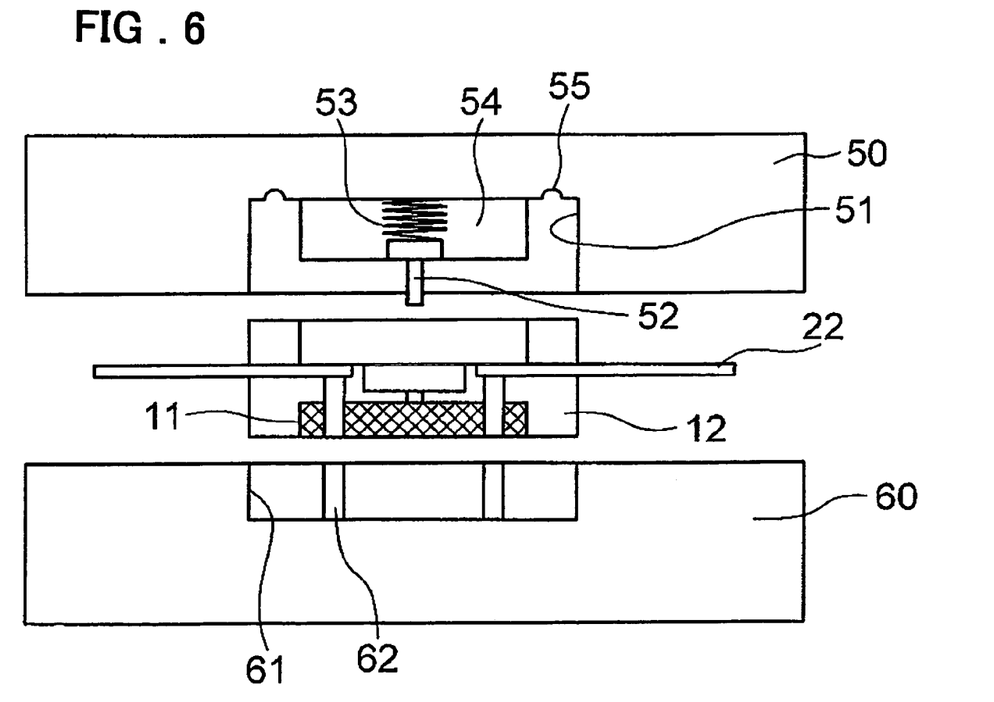
FIG. 6 is an evoluted sectional view exemplary showing a molding die which is used in the manufacturing process of the present invention and a heat sink and a lead frame, which are molded by the molding die.
Figure 7:
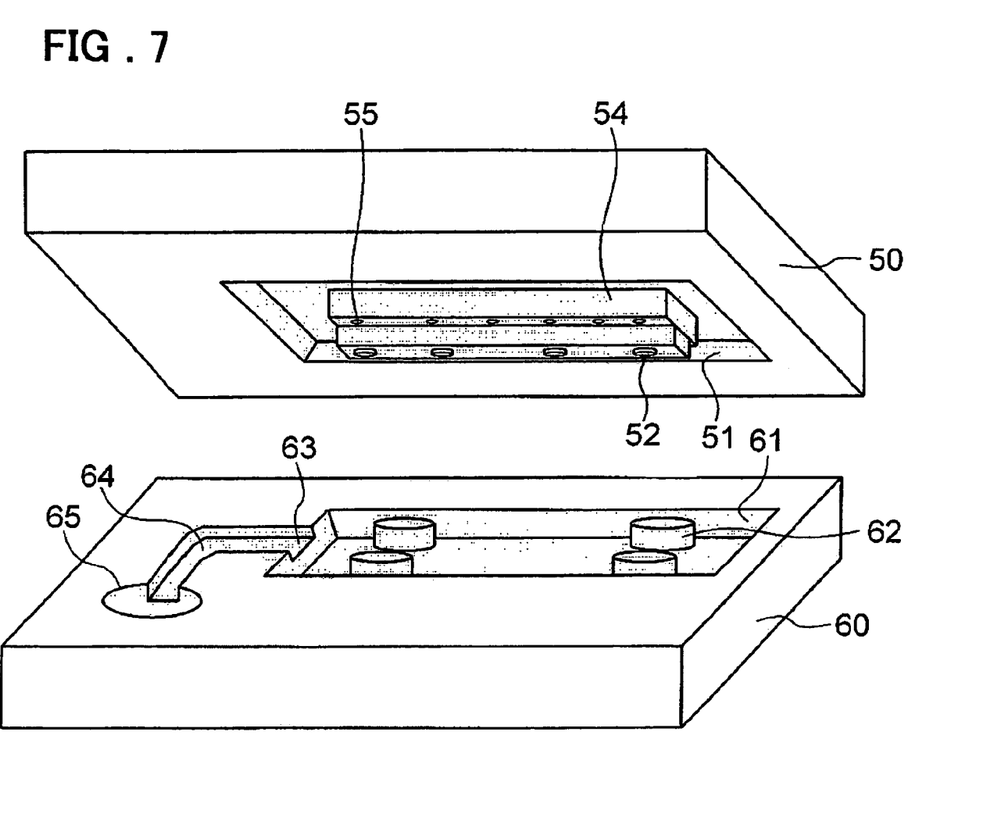
FIG. 7 is an evoluted perspective view showing the molding die of FIG. 6.

FIG. 6 shows a mold which is preferably used for manufacturing the hollow molded case of the resin molded semiconductor device of the present invention as well as the hollow molded case which is molded by the mold and the heat sink 11. FIG. 7 is a schematic perspective view showing only the mold. The mold comprises an upper half mold 50 having an upper cavity 51 and a lower half mold 60 having a lower cavity 61. A land forming block 51 of two-step structure having wide and narrow portions is accommodated in the upper cavity 61. Heat sink biasing (pressing) pins 52 which are biased from the bottom of the upper cavity 54 by means of springs 53 project from the inside of the land forming block 51 toward the lower half mold 60. The land forming block 54 is formed on its bottom of the upper cavity 51 on the periphery thereof with a plurality of holes 55 for receiving the projections. The upper and lower mold halves may be exchanged with each other.

A plurality of lead frame biasing pins 62 are disposed within the lower cavity 61 of the lower half mold 60. The lower half mold 60 is provided with a gate 63 opening to the lower cavity 61, a runner extending from the gate 63 and a pot 65, so that they form a passage for causing a molding resin to flow from the lower cavity 61.

When the hollow molded case 12 is molded in FIG. 6, the heat sink 11 is placed in the lower half mold 60 and the lead frame 22 is placed in the upper half mold 50 for carrying out mold clamping. Since the heat sink biasing pin 52 which is incorporated in the upper mold 50 biases (presses) the heat sink 11 placed in the lower half mold 50 in a downward direction by a biasing force of the spring 53 at this time, the heat sink 11 is caused to tightly contact with the bottom of the lower cavity 61 of the lower half mold 50. The lead frame 22 is clamped between the biasing pin 62 formed on the lower half mold 60 and the shoulder of the land forming block 54 formed on the upper half mold 50. Under this condition, the hollow molded case 12 is formed by casting a sealing resin for forming a package into the mold.

Figures 8A, 8B:
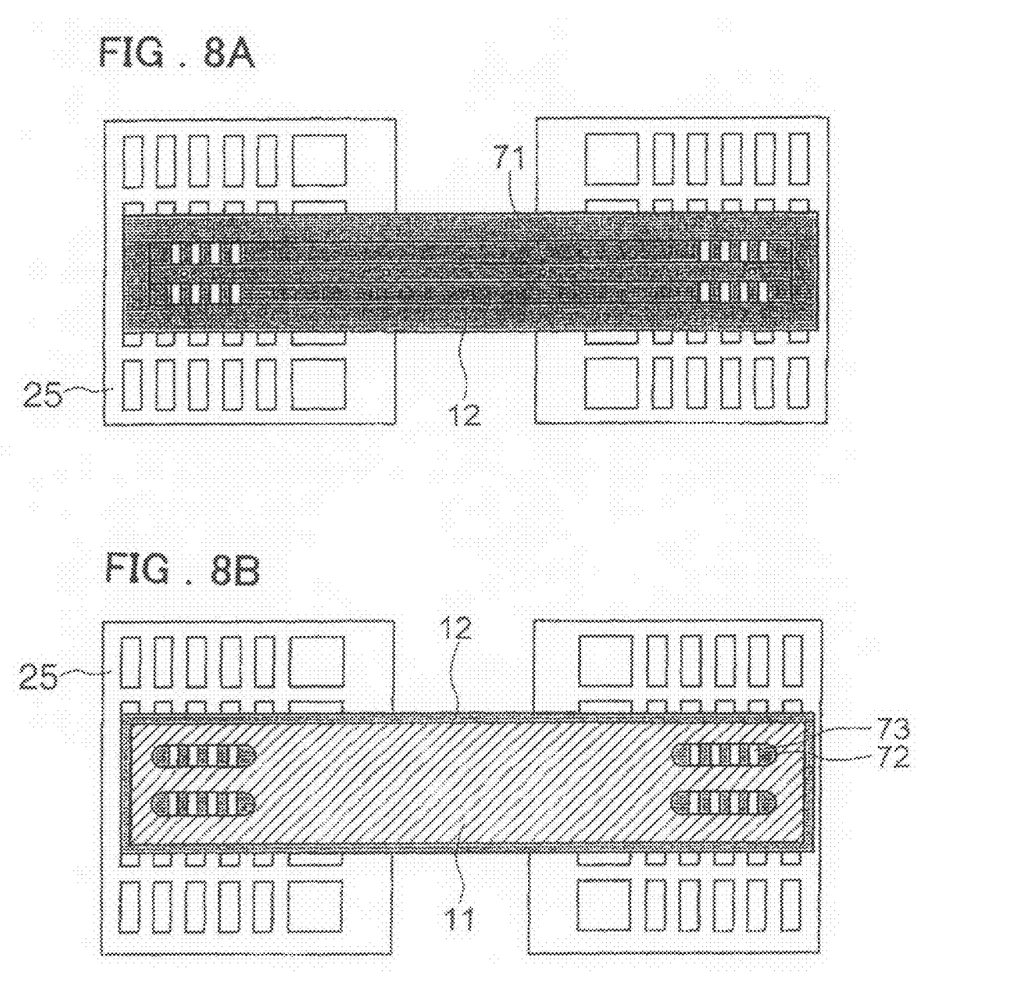
FIG. 8A and 8B are longitudinal sectional views showing the housing including the hollow molded face which is molded by the molding die of FIG. 6.

FIGS. 8A and 8B show a horizontal longitudinal section of the housing including the hollow molded case 12 which is manufactured by using the above-mentioned mold. FIG. 8A shows the section of the housing in the vicinity of the support face of the heat sink and FIG. 8B shows the section of the housing in the vicinity of the rear side of the heat sink. Occurrence of burrs on the rear side of the heat sink 11 can be prevented. Since a structure for biasing the heat sink biasing pins 52 by means of spring 53 is adopted in this case, reduction in burrs is enabled without being influenced by variations in thickness of the heat sink 11. Sticking of the molding resin to exposed faces of the inner leads can also be prevented.

CCD devices having excellent appearance and improved heat dissipation can be obtained due to the fact that burrs are eliminated from the rear side of the heat sink 11. Since sticking of the mold resin to the inner leads can be prevented, troubles such as failure of connection on bonding is prevented. Since the chip mount face can be formed with a high precision by the presence of the land forming block 54, the image can be focused on the surface of the CCD element with a high precision. Pin traces 71 which are formed by the heat sink biasing pins 52 contribute to heat dissipation from the support face of the heat sink 11. The heat sink 11 is formed with holes 72 through which the lead biasing pins 62 pass. The pin trances 73 are formed on the holes 72 by the lead biasing pins 62.

Figure 9A:
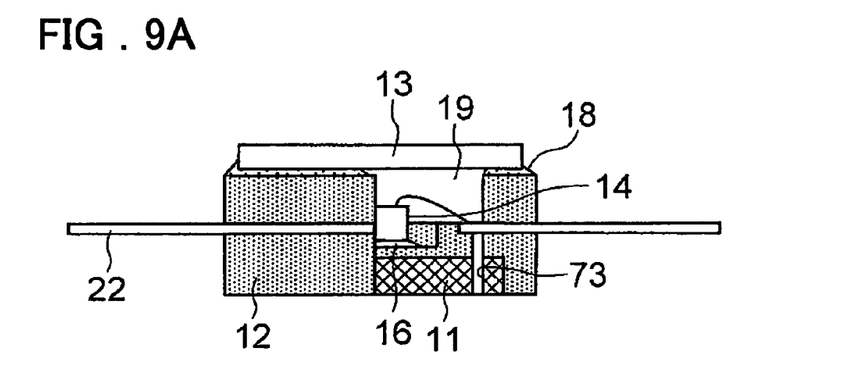
FIG. 9A and 9B are a cross-sectional and longitudinal sectional views showing the CCD device which is manufactured by using the molding die of FIG. 6, respectively.
Figure 9B:
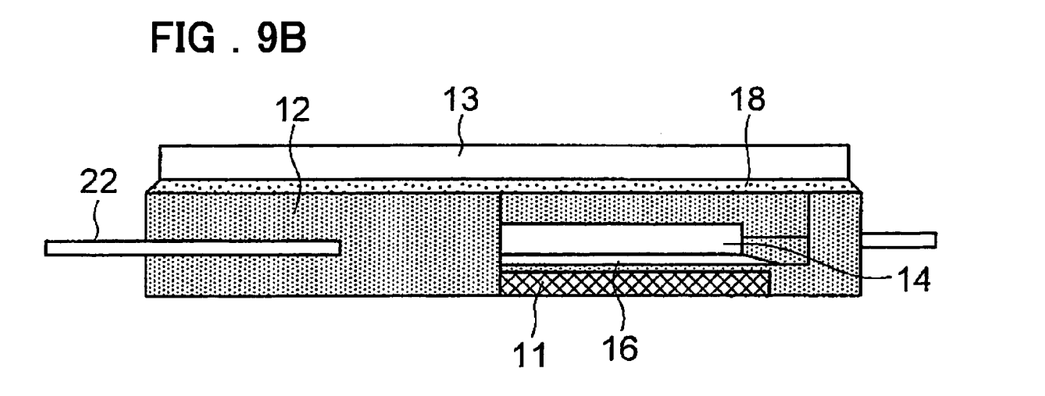

FIGS. 9A and 9B are a cross-sectional and longitudinal sectional views showing the CCD device which is manufactured by using the above-mentioned mold, respectively. The CCD device shown in FIGS. 9A and 9B are different from the molded semiconductor device of the first embodiment shown in FIGS. 1A and 1B in that the support face of the heat sink 11 is covered with a thin resin layer which forms the hollow molded case 12 and in that the holes 73 are formed for the lead frame biasing pins which connect to leads of the lead frame 22.

Although the present invention has been described by way of preferred embodiments, the resin molded semiconductor device and mold are not limited to the structures of the foregoing embodiments. It is to be noted that various modifications and alternations are possible within the spirit and scope of the present invention.

The meritorious effects of the present invention are summarized as follows.

Since warpage of the semiconductor chip can be reduced by matching the thermal coefficient of the heat sink to that of the hollow molded case in the resin molded semiconductor device of the present invention, excellent image can be obtained particularly if the device is used as CCD device or opto-electronic device, in general.

The mold of the present invention can prevent the mold resin from sticking to the lead frame, so that a trouble of connection between the bonding pads and the inner leads of the semiconductor chip can be avoided.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A molding die comprising:
    a first half mold having a first cavity and a second half mold having a second cavity, said first cavity including a block for forming a semiconductor chip accommodating space,
    wherein said block is formed of a two-step structure comprising a wide portion which is in contact with a bottom of said first cavity and a narrow portion which is mounted on said wide portion, wherein a pressing pin extends from a bottom of said second cavity and is configured to press a lead frame upon said wide portion of said block, and wherein another pressing pin projects from said narrow portion toward said second cavity.

2. The molding die as defined in claim 1, wherein said another pressing pin is variably extendable from the surface of said narrow portion.

3. The molding die as defined in claim 2, wherein said another pressing pin is biased by a spring located in said block.

4. The molding die as defined in claim 1, further comprising:
a hole disposed in said bottom of said first cavity.

5. The molding die as defined in claim 1, further comprising:
a plurality of pressing pins extending from a bottom of said second cavity configured to press a lead frame upon said wide portion of said block.

6. The molding die as defined in claim 5, further comprising:
a plurality of holes disposed in said bottom of said first cavity.

7. The molding die as defined in claim 1, wherein said block is configured to form a channel-type land in a resin molded semiconductor device.

8. The molding die as defined in claim 1, wherein said block is configured in a linear direction having an inverted T-shaped cross section.

9. A molding die comprising:
a first half mold having a first cavity including a land forming block for forming a linear channel in a resin molded semiconductor device; and
a second half mold having a second cavity including a pressing pin that extends from a bottom of said second cavity toward said first half mold,
wherein said land forming block comprises a tiered structure including a wide portion on a bottom of said first cavity and a narrow portion mounted on said wide portion,
wherein said pressing pin is configured to press a lead frame upon said wide portion of said land forming block, and
wherein another pressing pin projects from said narrow portion toward said second cavity.

10. The molding die as defined in claim 9, wherein said another pressing pin is disposed to variably extend from the surface of said narrow portion.

11. The molding die as defined in claim 9, wherein said another pressing pin is biased by a spring located in said land forming block.

12. The molding die as defined in claim 9, further comprising:
a hole disposed in said bottom of said first cavity.

13. The molding die as defined in claim 9, further comprising:
a plurality of pressing pins extending from a bottom of said second cavity configured to press a lead frame upon said wide portion of said block.

14. The molding die as defined in claim 13, further comprising:
a plurality of holes disposed in said bottom of said first cavity.

15. The molding die as defined in claim 9, wherein said land forming block is configured to form a channel-type land in a resin molded semiconductor device.

16. The molding die as defined in claim 9, wherein said land forming block is configured in a linear direction having an inverted T-shaped cross section.

17. A molding die comprising:
a first half mold having a first cavity including a land forming block for forming a linear T-shaped channel in a resin molded semiconductor device; and
a second half mold having a second cavity including a pressing pin that extends from a bottom of said second cavity toward said first half mold,
wherein said pressing pin is configured to press a lead frame upon a wide portion of said land forming block, and
wherein another pressing pin projects from said land forming block toward said second cavity.

18. The molding die as defined in claim 17, wherein said land forming block is formed of a two-step structure comprising said wide portion disposed a bottom of said first cavity and a narrow portion mounted on said wide portion.

* * * * *